United States Patent
Sugawara et al.

(10) Patent No.: US 10,886,112 B2
(45) Date of Patent: *Jan. 5, 2021

(54) MN—ZN—W—O SPUTTERING TARGET AND PRODUCTION METHOD THEREFOR

(71) Applicant: Dexerials Corporation, Tokyo (JP)

(72) Inventors: Junichi Sugawara, Tome (JP); Yuichi Kamori, Tome (JP); Fusashige Tokutake, Sendai (JP)

(73) Assignee: Dexerials Corporation, Tokyo (JP)

( * ) Notice: Subject to any disclaimer, the term of this patent is extended or adjusted under 35 U.S.C. 154(b) by 478 days.

This patent is subject to a terminal disclaimer.

(21) Appl. No.: 15/546,122

(22) PCT Filed: Jan. 25, 2016

(86) PCT No.: PCT/JP2016/000352
§ 371 (c)(1),
(2) Date: Jul. 25, 2017

(87) PCT Pub. No.: WO2016/121367
PCT Pub. Date: Aug. 4, 2016

(65) Prior Publication Data
US 2018/0186699 A1    Jul. 5, 2018

(30) Foreign Application Priority Data
Jan. 27, 2015  (JP) .................. 2015-013577

(51) Int. Cl.
*H01J 37/34* (2006.01)
*C23C 14/08* (2006.01)
(Continued)

(52) U.S. Cl.
CPC ........ *H01J 37/3429* (2013.01); *C04B 35/016* (2013.01); *C04B 35/453* (2013.01);
(Continued)

(58) Field of Classification Search
CPC ............... H01J 37/3426; H01J 37/3429; H01J 37/3491; C23C 14/34; C23C 14/3414;
(Continued)

(56) References Cited

U.S. PATENT DOCUMENTS 5,114,468 A * 5/1992 Akutsu ................ C22C 1/0425
75/234
2008/0057350 A1   3/2008 Das et al.
(Continued)

FOREIGN PATENT DOCUMENTS

| CN | 101136213 A | 3/2008 |
| TW | 200700572 A | 1/2007 |

(Continued)

OTHER PUBLICATIONS

Jan. 29, 2019, Notification of Reasons for Refusal issued by the Japan Patent Office in the corresponding Japanese Patent Application No. 2015-013577.
Mar. 8, 2016, International Search Report issued in the International Patent Application No. PCT/JP2016/000352.
Zhang Huafu et al., Low-temperature deposition of transparent conducting Mn—W co-doped ZnO thin films, Journal of Semiconductors, Aug. 2010, pp. 083005-1 to 083005-3, vol. 31, No. 8, ISSN 1674-4926.

(Continued)

*Primary Examiner* — Michael A Band
(74) *Attorney, Agent, or Firm* — Kenja IP Law PC

(57) ABSTRACT

Provided are a Mn—Zn—W—O sputtering target having excellent crack resistance and a production method therefor. The Mn—Zn—W—O sputtering target has a chemical composition containing Mn, Zn, W, and O. From an X-ray diffraction pattern of the Mn—Zn—W—O sputtering target, a ratio $P_{MnO}/P_W$ of a maximum peak intensity $P_{MnO}$ of a peak due to a manganese oxide composed only of Mn and O to a maximum peak intensity $P_W$ of a peak due to W is 0.027 or less.

6 Claims, 1 Drawing Sheet

(51) Int. Cl.
- C04B 35/645 (2006.01)
- C04B 35/495 (2006.01)
- C04B 35/453 (2006.01)
- C04B 35/01 (2006.01)
- G11B 7/243 (2013.01)
- C23C 14/34 (2006.01)

(52) U.S. Cl.
CPC .......... *C04B 35/495* (2013.01); *C04B 35/645* (2013.01); *C23C 14/08* (2013.01); *C23C 14/34* (2013.01); *C23C 14/3414* (2013.01); *G11B 7/243* (2013.01); *H01J 37/3491* (2013.01); *C04B 2235/3206* (2013.01); *C04B 2235/3217* (2013.01); *C04B 2235/3224* (2013.01); *C04B 2235/3239* (2013.01); *C04B 2235/3241* (2013.01); *C04B 2235/3244* (2013.01); *C04B 2235/3251* (2013.01); *C04B 2235/3256* (2013.01); *C04B 2235/3258* (2013.01); *C04B 2235/3262* (2013.01); *C04B 2235/3263* (2013.01); *C04B 2235/3268* (2013.01); *C04B 2235/3275* (2013.01); *C04B 2235/3279* (2013.01); *C04B 2235/3286* (2013.01); *C04B 2235/3287* (2013.01); *C04B 2235/3289* (2013.01); *C04B 2235/3291* (2013.01); *C04B 2235/3293* (2013.01); *C04B 2235/3298* (2013.01); *C04B 2235/3418* (2013.01); *C04B 2235/404* (2013.01); *C04B 2235/42* (2013.01); *C04B 2235/5436* (2013.01); *C04B 2235/6567* (2013.01); *C04B 2235/80* (2013.01)

(58) Field of Classification Search
CPC ..... C23C 14/08; C04B 35/016; C04B 35/495; C04B 35/645; C04B 35/453; G11B 7/243
See application file for complete search history.

(56) References Cited

U.S. PATENT DOCUMENTS

| 2018/0019109 A1* | 1/2018 | Sugawara | ............. C04B 35/453 |
| 2019/0242009 A1* | 8/2019 | Sugawara | ............... C23C 14/08 |

FOREIGN PATENT DOCUMENTS

| WO | 2009096165 A1 | 8/2009 |
| WO | 2013183277 A1 | 12/2013 |

OTHER PUBLICATIONS

Aug. 1, 2017, International Preliminary Report on Patentability issued in the International Patent Application No. PCT/JP2016/000352.

Mar. 29, 2019, Office Action issued by the Taiwan Intellectual Property Office in the corresponding Taiwanese Patent Application No. 105102413.

Nov. 15, 2018, Office Action issued by the State Intellectual Property Office in the corresponding Chinese Patent Application No. 201680005746.9.

* cited by examiner

MN—ZN—W—O SPUTTERING TARGET AND PRODUCTION METHOD THEREFOR

CROSS-REFERENCE TO RELATED APPLICATION

This application claims priority of Japanese Patent Application No. 2015-013577 (filed on Jan. 27, 2015), the entire disclosure of which is incorporated herein by reference.

TECHNICAL FIELD

This disclosure relates to a Mn—Zn—W—O sputtering target and a production method therefor, and in particular relates to a Mn—Zn—W—O sputtering target that is suitable for use in forming a recording layer of an optical information recording medium and a production method for this sputtering target.

BACKGROUND

A sputtering method whereby Ar ions are caused to collide with a sputtering target formed from an alloy or sintered material is used in a wide range of technical fields such as glass coating, semiconductor device production, flat panel display production, and optical information recording medium (writable optical disc) recording layer formation.

Among these fields, in the technical field of optical information recording media, for example, there is increasing demand for high capacity as increasingly large amounts of data are handled. Optical information recording media can be broadly classified as either read-only or writable, and writable optical information recording media can be further categorized into two types: recordable (write-once) and rewritable. Conventionally, organic dye materials have been widely studied as recording layer materials for recordable optical discs, but with the recent trend toward higher capacity, inorganic materials are now also being widely studied.

At present, materials based on palladium oxides have been put into actual use as inorganic recording layer materials for recordable optical discs. However, due to the high material cost of Pd, which is a rare metal, materials based on manganese oxides are also being developed as materials through which adequate recording characteristics can be obtained at low material cost.

In one example of a recording layer formed from a material based on a manganese oxide as described above, PTL 1 proposes a Mn-based recording layer formed from a Mn—W—Zn—O material. Regarding the specific method of formation of this Mn-based recording layer, PTL 1 discloses co-sputtering (multi-target sputtering) of a Mn target, a Cu target, a W target, and a Zn target in a mixed gas atmosphere of Ar gas and $O_2$ gas. Through the technique described in PTL 1, a Mn-based recording layer formed from a Mn—W—Zn—O material can be obtained without using the rare metal Pd.

CITATION LIST

Patent Literature

PTL 1: WO 2013/183277 A1

SUMMARY

Technical Problem

When a layer containing a plurality of elements is to be formed by sputtering, such as the aforementioned Mn-based recording layer formed from the Mn—W—Zn—O material, one method that can be adopted is multi-target sputtering in which targets formed from the respective elements are sputtered as disclosed in PTL 1. In an alternative method, sputtering may be performed by using a composite target containing a plurality of elements as a single target. Use of a composite target is preferable from a viewpoint of mass production since multi-target sputtering has drawbacks such as requiring larger equipment, leading to increased cost, and being susceptible to deviations in composition.

PTL 1 proposes, as a sputtering target for use in production of an information recording medium, a target that includes an oxide of Mn, wherein the oxide of Mn is partially or fully present as an oxide of Mn with a valence of less than +4. PTL 1 also proposes that in this target, the oxide of Mn present in the aforementioned oxide state is preferably $Mn_3O_4$ that does not thermally decompose. Moreover, PTL 1 proposes that the target may further contain a metal other than Mn or an oxide of a metal other than Mn, and that this other metal is at least one selected from the group consisting of Sn, Zn, Bi, Ge, Co, W, Cu, and Al.

However, PTL 1 does not allude to a specific Mn—Zn—W—O composite sputtering target. Moreover, a Mn—Zn—W—O composite sputtering target having a chemical composition containing Mn, Zn, W, and O has not yet been identified.

Accordingly, an objective of this disclosure is to provide a Mn—Zn—W—O sputtering target and a production method therefor.

Solution to Problem

The inventors conducted extensive studies to achieve the above objective in which they attempted to prepare a Mn—Zn—W—O sputtering target using $Mn_3O_4$ powder, ZnO powder, and W powder as raw materials. However, experiments conducted by the inventors revealed that Mn—Zn—W—O sputtering targets prepared as trial samples included some samples that had poor crack resistance and cracked during sputtering. The inventors conducted diligent investigation into the cause of this cracking and discovered that crack resistance of a Mn—Zn—W—O sputtering target is dependent on manganese oxides that are composed only of Mn and O. Upon further investigation, the inventors discovered that when a $Mn_3O_4$ crystalline phase is present in a target such as proposed in PTL 1, this actually results in the target having poorer crack resistance. Moreover, the inventors found that crack resistance of a target can be improved by eliminating manganese oxides composed only of Mn and O to as great an extent as possible. This finding led to the present disclosure.

This disclosure is based on the above findings by the inventors and provides the following as a solution to the problems set forth above. Specifically, this disclosure provides:

<1> A Mn—Zn—W—O sputtering target comprising a chemical composition containing Mn, Zn, W, and O, wherein from an X-ray diffraction pattern of the Mn—Zn—W—O sputtering target, a ratio $P_{MnO}/P_W$ of a maximum peak intensity $P_{MnO}$ of a peak due to a manganese oxide composed only of Mn and O to a maximum peak intensity $P_W$ of a peak due to W is 0.027 or less.

Through the Mn—Zn—W—O sputtering target according to the foregoing <1>, it is possible to provide a Mn—Zn—W—O sputtering target having excellent crack resistance in which a manganese oxide composed only of Mn and O is not substantially present.

<2> The Mn—Zn—W—O sputtering target according to the foregoing <1>, wherein
from the X-ray diffraction pattern of the Mn—Zn—W—O sputtering target, a peak due to a WMnO$_4$ crystalline phase is observed.

<3> The Mn—Zn—W—O sputtering target according to the foregoing <1> or <2>, wherein
from the X-ray diffraction pattern of the Mn—Zn—W—O sputtering target, a ratio $P_{WMnO}/P_W$ of a maximum peak intensity $P_{WMnO}$ of a peak due to the WMnO$_4$ crystalline phase to the maximum peak intensity $P_W$ is 0.024 or more.

<4> The Mn—Zn—W—O sputtering target according to the foregoing <1> or <2>, wherein
the chemical composition contains 4 at % to 40 at % of Mn, 15 at % to 60 at % of Zn, and 5 at % to 40 at % of W relative to 100 at %, in total, of Mn, Zn, and W.

<5> The Mn—Zn—W—O sputtering target according to the foregoing <1> or <2>, wherein
the chemical composition further includes a single one or two or more elements selected from the group consisting of Cu, Mg, Ag, Ru, Ni, Zr, Mo, Sn, Bi, Ge, Co, Al, In, Pd, Ga, Te, V, Si, Ta, Cr, and Tb.

<6> The Mn—Zn—W—O sputtering target according to the foregoing <5>, wherein
the single one or two or more elements has a content of 8 at % to 70 at % relative to 100 at %, in total, of constituent elements of the Mn—Zn—W—O sputtering target, exclusive of O.

<7> A production method for producing the Mn—Zn—W—O sputtering target according to the foregoing <1>, comprising:
a mixing step of wet mixing a mixed powder containing a powder including a Mn as a component, a powder including a Zn as a component, and a powder including a W as a component for 12 hours or longer; and
a sintering step of sintering the mixed powder at a temperature of 700° C. or higher after the mixing step.

Through the production method according to the foregoing <7>, it is possible to provide a production method for a Mn—Zn—W—O sputtering target having excellent crack resistance.

<8> The production method according to the foregoing <7>, wherein
the powder including the Mn is selected from a powder of a manganese oxide, the powder including the Zn is selected from a powder of a zinc oxide, and the powder including the W is selected from a metal tungsten powder.

<9> The production method according to the foregoing <7> or <8>, wherein
the mixed powder further includes a powder formed from a single one element or compound of two or more elements selected from the group consisting of Cu, Mg, Ag, Ru, Ni, Zr, Mo, Sn, Bi, Ge, Co, Al, In, Pd, Ga, Te, V, Si, Ta, Cr, and Tb.

Advantageous Effect

Through this disclosure, it is possible to solve the conventional problems set forth above and achieve the above objective, and to provide a Mn—Zn—W—O sputtering target having excellent crack resistance and a production method therefor.

BRIEF DESCRIPTION OF THE DRAWINGS

In the accompanying drawings.

Figure 1:
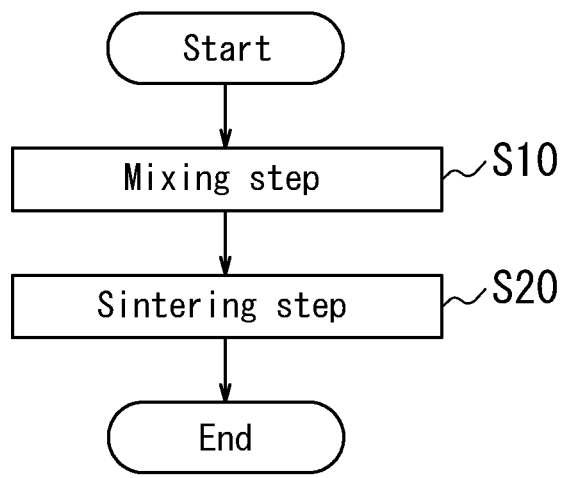
FIG. 1 is a flowchart illustrating a production method for a sputtering target according to a disclosed embodiment.

DETAILED DESCRIPTION (Mn—Zn—W—O Sputtering Target)
A presently disclosed Mn—Zn—W—O sputtering target has a chemical composition containing Mn, Zn, W, and O. The following provides a detailed description of the disclosed Mn—Zn—W—O sputtering target, which is also referred to herein simply as a "target".

<Target>
A target according to a disclosed embodiment has a chemical composition that contains Mn, Zn, W, and O, and may further contain other components as necessary.

From an X-ray diffraction pattern of the target, a ratio $P_{MnO}/P_W$ of a maximum peak intensity $P_{MnO}$ of a peak due to a manganese oxide composed only of Mn and O to a maximum peak intensity $P_W$ of a peak due to W is 0.027 or less.

<<Manganese Oxide Composed Only of Mn and O>>
The phrase "manganese oxide composed only of Mn and O" refers to manganese oxides such as Mn$_3$O$_4$ (manganese (II,III) oxide) and Mn$_2$O$_3$ (manganese(III) oxide) and is exclusive of manganese composite oxides that include one or more elements other than Mn and O, such as WMnO$_4$ described further below. Other examples of manganese oxides include MnO, MnO$_2$, MnO$_3$, and Mn$_2$O$_7$. In the present specification, among manganese oxides, a manganese oxide composed only of Mn and O is referred to simply as a "manganese oxide", whereas a composite oxide including one or more elements other than Mn and O is referred to as a "manganese composite oxide" in order to distinguish between these oxides. In the present embodiment, it is important that a manganese oxide crystalline phase is not substantially observed in the target. The substantial presence or absence of a manganese oxide crystalline phase is determined based on peak intensities in the X-ray diffraction.

<<Intensities from X-Ray Diffraction Pattern of Target>>
An X-ray diffraction pattern of the target can be acquired in accordance with a conventional method. For example, a spectrum may be acquired by using a SmartLab produced by Rigaku Corporation to perform a θ:2θ scan of the surface of the target. In the present embodiment, characteristics of the target are determined by measuring at least the maximum peak intensity $P_W$ of a peak due to W and the maximum peak intensity $P_{MnO}$ of a peak due to a manganese oxide, and by optionally measuring the peak intensities of peaks due to other crystalline phases as necessary.

—Measurement Conditions—
The X-ray diffraction measurement conditions are set as appropriate depending on the target and may, for example, be selected from conditions in the following ranges.
X-ray source: Cu-Kα beam
Output setting: 20 kV to 100 kV, 10 mA to 100 mA
Measurement range: 2θ=5° to 80°
Scan rate: 1° to 4° (2θ/min), continuous scan
Divergence slit: 0.5° to 2°
Scattering slit: 0.5° to 2°
Receiving slit: 0.1 mm to 0.5 mm —Peak Intensities—

W diffraction peaks are detected in ranges such as 40.26°±0.3° and 58.27°±0.3°. A maximum value among diffraction peaks detected in these ranges is taken to be the maximum peak intensity $P_W$ (units: cps; same applies below) of a peak due to W. The maximum peak intensity $P_W$ is used as a reference intensity in the present embodiment. The reason for using the maximum peak intensity $P_W$ as the reference intensity is that in the X-ray diffraction pattern of the target according to the present embodiment, the maximum peak intensity $P_W$ of a peak due to W typically has the greatest intensity among maximum peak intensities of peaks due to the various components of the target. The following describes the maximum peak intensity $P_{MnO}$ of a peak due to a manganese oxide. $Mn_3O_4$ diffraction peaks, for example, are detected in ranges such as 28.88°±0.3° and 59.84°±0.3° and $Mn_2O_3$ diffraction peaks, for example, are detected in ranges such as 32.98°±0.3° and 55.24°±0.3°. Among the diffraction peaks detected in these ranges, when one or more manganese oxide diffraction peaks are significantly detected, the maximum value of peak intensities of peaks due to manganese oxides is taken to be the maximum peak intensity $P_{MnO}$, and when manganese oxide diffraction peaks are buried in the background of the X-ray diffraction pattern (for example, when the intensity thereof is 1.1 times the background intensity or less), it is determined that a diffraction peak is not detected and the peak intensity $P_{MnO}$ is taken to be 0 (zero).

So long as the ratio $P_{MnO}/P_W$ is 0.027 or less, a manganese oxide crystalline phase is not substantially observed in the target and the target has excellent crack resistance. At present, the reason that the target has excellent crack resistance as a result of a manganese oxide crystalline phase not being substantially observed therein (in other words, the logical reason for the significant presence of a manganese oxide crystalline phase in a target causing deterioration of crack resistance of the target) is not clear. However, the inventors consider that this may be due to inadequate sintering, resulting in low sintering density and poor mechanical characteristics.

As set forth above, a Mn—Zn—W—O target having excellent crack resistance can be provided according to the present embodiment. The target according to the present embodiment is particularly suitable for use in forming a recording layer of an optical information recording medium, but the use of the target is not in any way limited.

Also note that although no specific limitations are placed on the ratio $P_{MnO}/P_W$ other than being within the range set forth above, the ratio $P_{MnO}/P_W$ is preferably 0.027 or less, more preferably 0.01 or less, and most preferably 0 (i.e., a manganese oxide diffraction peak is not detected).

<<$WMnO_4$ Crystalline Phase>>

From the X-ray diffraction pattern of the target according to the present embodiment, it is preferable in terms of more reliably improving crack resistance of the target that a $WMnO_4$ crystalline phase is observed. This is because as sintering proceeds, manganese becomes present in the form of $WMnO_4$ and not in the form of a manganese oxide. The presence of a $WMnO_4$ crystalline phase can be determined through the presence of a peak due to the $WMnO_4$ crystalline phase. In the present embodiment, it is preferable that a peak due to a $WMnO_4$ crystalline phase is present. Note that when a peak due to the $WMnO_4$ crystalline phase is referred to as being "observed", this means that a significant peak is detected to the background of the X-ray diffraction pattern.

—Peak Intensity $P_{WMnO}$ of Peak Due to $WMnO_4$ Crystalline Phase—

Diffraction peaks due to the $WMnO_4$ crystalline phase are detected in ranges such as 29.80°±0.3° and 30.23°±0.3°. The intensity of a peak having a greatest intensity among such peaks is taken to be a maximum peak intensity $P_{WMnO}$. A ratio $P_{WMnO}/P_W$ is preferably 0.02 or more as this enables further improvement of crack resistance of the target. The ratio $P_{WMnO}/P_W$ is more preferably 0.03 or more, and most preferably 0.04 or more.

<<Component Ratio>>

The ratio of components in the target according to the present embodiment can be appropriately selected depending on the objective without any specific limitations. However, it is preferable that the target contains 4 at % to 40 at % of Mn, 15 at % to 60 at % of Zn, and 5 at % to 40 at % of W relative to 100 at %, in total, of Mn, Zn, and W.

<<Other Components>>

The chemical composition of the target according to the present embodiment preferably further includes a single one or two or more elements selected from the group consisting of Cu, Mg, Ag, Ru, Ni, Zr, Mo, Sn, Bi, Ge, Co, Al, In, Pd, Ga, Te, V, Si, Ta, Cr, and Tb. For example, in a situation in which the target according to the present embodiment is to be used for forming a recording layer of an information recording medium, further inclusion of these elements in the chemical composition is useful for altering transmittance, reflectance, and recording sensitivity, and obtaining a recording layer having a multilayer structure.

—Component Ratio of Other Components—

The content of the includes a single one or two or more elements selected from the aforementioned group may be 8 at % to 70 at % relative to 100 at %, in total, of constituent elements of the sputtering target, exclusive of O (oxygen).

No specific limitations are placed on the shape of the target according to the present embodiment and the target may have any shape such as a disc shape, a cylindrical shape, a quadrilateral plate shape, a rectangular plate shape, or a square shape. The shape of the target can be appropriately selected depending on the use thereof. Moreover, the width and depth (diameter in the case of a circular shape) of the target can be appropriately selected depending on the use of the target within a range of millimeters to meters. In the case of a circular shape, the diameter of the target is typically about 50 mm to 300 mm. In the same way, the thickness of the target can be appropriately selected depending on the use of the target and is typically about 1 mm to 20 mm.

<Production Method for Target>

Next, a production method for the target according to the disclosed embodiment is described with reference to FIG. 1. The production method for the target according to the disclosed embodiment includes a mixing step (S10) and a sintering step (S20), and may further include other steps that are appropriately selected as necessary.

<<Mixing Step (S10)>>

The mixing step (S10) is a wet mixing step of mixing mixed powder containing a powder including a Mn as a component, a powder including a Zn as a component, and a powder including a W as a component for 12 hours or longer.

The method of wet mixing can be appropriately selected depending on the objective without any specific limitations and may, for example, be a wet mixing method using a conventional and commonly known ball mill. The following describes the mixed powder that is mixed in this mixing step and also the mixing conditions.

The mixed powder containing the powder including the Mn, the powder including the Zn, and the powder including the W, and may include other powders as necessary.

—Powder Including Mn—

The powder including the Mn can be appropriately selected depending on the objective and may, for example, be a powder formed from a single one element of Mn (a simple substance of Mn), a manganese compound powder, or a powder of a manganese oxide (for example, $Mn_3O_4$ or $Mn_2O_3$). One of such powders including the Mn may be used individually, or two or more of such Mn-containing powders may be used together.

Of these powders, a powder of a manganese oxide is preferable, and $Mn_3O_4$ powder is more preferable. This is due to the relationship between the sintering temperature and melting point.

The average particle diameter of the powder including the Mn can be appropriately selected depending on the objective. Moreover, the average particle diameter of the aforementioned $Mn_3O_4$ powder may be about 3 μm to 7 μm as is commercially available.

—Powder Including the Zn—

The powder including the Zn can be appropriately selected depending on the objective and may, for example, be a powder formed from a single one element of Zn (a simple substance of Zn), a zinc compound powder, or a powder of a zinc oxide. One of such powders including the Zn may be used individually, or two or more of such powders including the Zn may be used together.

Of these powders, a powder of a zinc oxide is preferable, and ZnO powder is more preferable. This is due to the relationship between the sintering temperature and melting point.

The average particle diameter of the powder including the Zn can be appropriately selected depending on the objective. Moreover, the average particle diameter of the aforementioned ZnO powder may be about 1 μm to 3 μm as is commercially available.

—Powder Including the W—

The powder including the W can be appropriately selected depending on the objective and may, for example, be a powder formed from a single one element of W (a simple substance of W), a tungsten compound powder, or a powder of a tungsten oxide. One of such powders including the W may be used individually, or two or more of such powders including the W may be used together.

Of these powders, a metal tungsten powder formed from a simple substance of W is preferable. This is in order to impart conductivity.

The average particle diameter of the powder including the W can be appropriately selected depending on the objective. Moreover, the average particle diameter of the aforementioned W powder may be about 2 μm to 5 μm as is commercially available.

—Other Powders—

Examples of other powders that can be selected as appropriate depending on the objective include powders formed from a single one element or compound of two or more elements selected from the group consisting of Cu, Mg, Ag, Ru, Ni, Zr, Mo, Sn, Bi, Ge, Co, Al, In, Pd, Ga, Te, V, Si, Ta, Cr, and Tb. Such powders may be included in the mixed powder depending on the desired objective of the produced target.

—Mixing Time—

In the present embodiment, it is important that wet mixing of the mixed powder is performed for 12 hours or longer. A mixing time of 12 hours or longer enables adequate mixing of the mixed powder, and can, therefore, promote a solid phase reaction of a manganese oxide during sintering and inhibit the presence of a residual manganese oxide crystalline phase after sintering. Within the range set forth above, a mixing time of 16 hours or longer is preferable, a mixing time of 20 hours or longer is more preferable, and a mixing time of 24 hours or longer is most preferable. Mixing may be performed for more than 24 hours even though the effect of mixing reaches saturation when mixing is performed for 24 hours. An upper limit of 168 hours may be set for the mixing time in consideration of industrial productivity, but this is not intended to be a restriction on the upper limit.

<<Sintering Step (S20)>>

The sintering step (S20) is a step that is performed after the mixing step and in which sintering of the mixed powder is performed at a temperature of 700° C. or higher.

—Sintering—

The method of sintering can be appropriately selected depending on the objective without any specific limitations and may, for example, be hot pressing or hot isostatic pressing (HIP) in an inert gas atmosphere.

In the present embodiment, it is important that sintering of the mixed powder is performed at a temperature of 700° C. or higher. A sintering temperature of 700° C. or higher can inhibit the presence of a residual manganese oxide crystalline phase.

The sintering time can be appropriately selected without any specific limitations and may, for example, be a typically adopted sintering time of about 1 hour to 6 hours.

From an X-ray diffraction pattern of a Mn—Zn—W—O sputtering target produced through the steps described above, a ratio $P_{MnO}/P_W$ of a maximum peak intensity $P_{MnO}$ of a peak due to a manganese oxide composed only of Mn and O to a maximum peak intensity $P_W$ of a peak due to W is 0.027 or less. Accordingly, a target having excellent crack resistance can be produced.

<<Other Steps>>

Other steps can be appropriately selected depending on the objective without any specific limitations. Examples of other steps that may be performed include a mixed powder shaping step.

—Shaping Step—

The shaping step is not essential in the disclosed production method, but may be included for shaping in accordance with the target shape.

The following provides a more detailed description of the disclosed techniques through examples. However, the disclosed techniques are not in any way limited by the following examples and various alterations may be made that do not deviate from the essential scope thereof.

EXAMPLES

As described below, Example 1 was prepared as a target according to the present disclosure and Comparative Examples 1 and 2 were prepared as comparative targets, and the crack resistance of these targets was evaluated.

Example 1

The following powders were prepared as raw material powders.

$Mn_3O_4$ powder (purity: 99.9% or higher, average particle diameter: 5 μm)

ZnO powder (purity: 99.9% or higher, average particle diameter: 1.4 μm)

W powder (purity: 99.9% or higher, average particle diameter: 3 μm)

The $Mn_3O_4$ powder, ZnO powder, and W powder were weighed out such that the proportions of metal elements satisfied Mn:W:Zn=20:30:50 (at %). The weighed-out raw material powders, zirconia balls (diameter 5 mm) in an amount equivalent to three times the total weight of the raw material powders, and alcohol were added into a plastic container and were subjected to wet mixing for 24 hours in a ball mill. The resultant mixed powder was were dried and was then sifted through a sieve having a pore size of 500 μm. Next, the sifted powder was subjected to hot pressing in an inert gas atmosphere with a sintering temperature of 900° C., a sintering time of 2 hours, and a pressure of 200 kgf/cm² to prepare a target according to Example 1.

Comparative Example 1

A target according to Comparative Example 1 was prepared in the same way as in Example 1 with the exception that a mixing time of 2 hours was adopted instead of the mixing time of 24 hours adopted in Example 1.

Comparative Example 2

A target according to Comparative Example 2 was prepared in the same way as in Example 1 with the exception that a sintering temperature of 600° C. was adopted instead of the sintering temperature of 900° C. adopted in Example 1.

Evaluation

The targets prepared in Example 1 and Comparative Examples 1 and 2 were subjected to (A) component evaluation and (B) crack resistance evaluation. These evaluations were performed as follows.

(A) Component Evaluation

Figure 2:
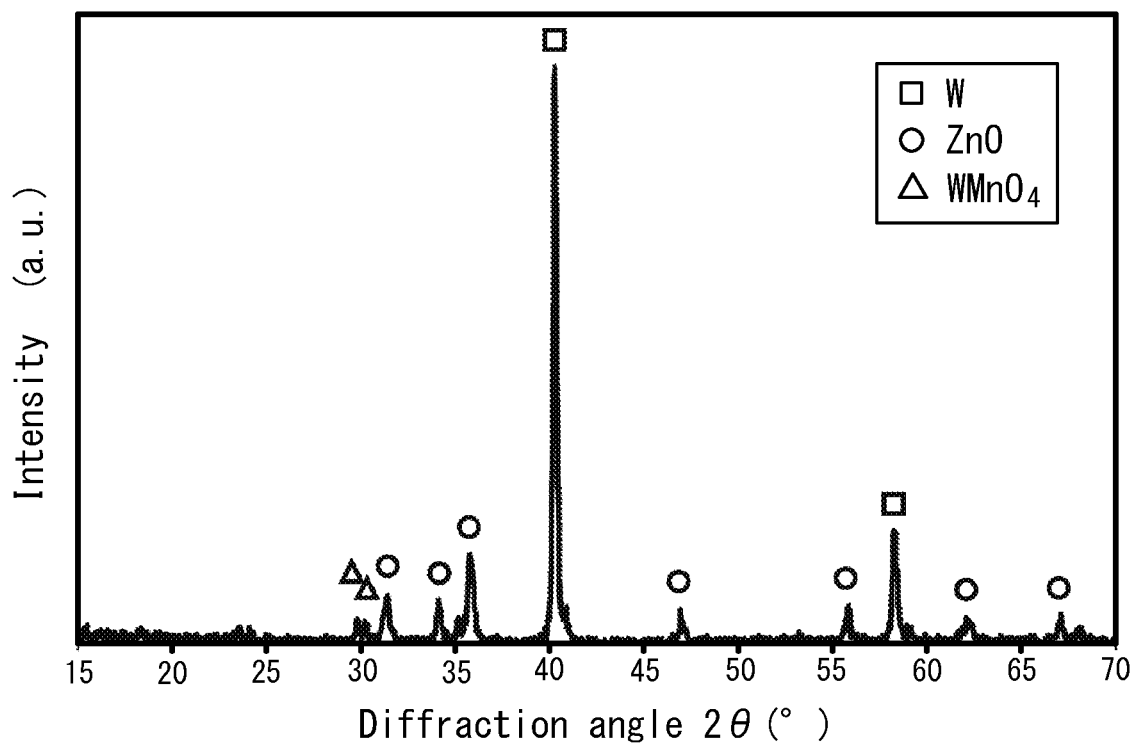
FIG. 2 is an X-ray diffraction pattern of a sputtering target according to Example 1.

Components in the targets according to Example 1 and Comparative Examples 1 and 2 were evaluated by X-ray diffraction. In the X-ray diffraction, a θ:2θ scan was performed using a SmartLab produced by Rigaku Corporation to acquire an X-ray diffraction pattern. The X-ray diffraction pattern for Example 1 is illustrated in FIG. 2 as a representative example. Note that intensities are in arbitrary units (a.u.). Table 1 shows peak intensity ratios in which the maximum peak intensity of a peak due to W is denoted $P_W$, the maximum peak intensity of a peak due to a manganese oxide is denoted $P_{MnO}$, and the maximum peak intensity of a peak due to a $WMnO_4$ crystalline phase is denoted $P_{WMnO}$. Note that peaks that are buried in the background are determined to have a peak intensity of 0. The experimental conditions were as follows.

X-ray source: Cu-Kα beam
Output setting: 30 kV, 15 mA
Measurement range: 2θ=15° to 70°
Scan rate: 2° (2θ/min), continuous scan
Divergence slit: 1°
Scattering slit: 1°
Receiving slit: 0.3 mm (B) Crack Resistance Evaluation The targets according to Example 1 and Comparative Examples 1 and 2 were each bonded to a backing plate made of oxygen-free copper using In solder. The bonded target was installed in a sputtering apparatus. Next, the inside of the sputtering apparatus was evacuated to $1 \times 10^{-4}$ Pa or lower, and Ar gas and $O_2$ gas were introduced into the apparatus to provide an apparatus internal pressure of 0.3 Pa. The partial pressure of oxygen ($[O_2]/[Ar+O_2]$) was set as 70%. A DC power supply was used to apply 5 W/cm² of electrical power and sputtering was performed for 30 minutes, after which, the target was removed from the sputtering apparatus. Each of the targets was inspected by eye for the occurrence of cracking. Crack resistance of the targets was evaluated based on the following evaluation standard.

Good: Cracking not observed
Poor: Cracking observed

The results are shown in Table 1.

TABLE 1

| | Preparation conditions | | Peak intensity ratio | | |
| --- | --- | --- | --- | --- | --- |
| | Mixing time | Sintering temperature | $P_{MnO}/P_W$ | $P_{WMnO}/P_W$ | Crack resistance |
| Example 1 | 24 hours | 900° C. | 0 | 0.04 | Good |
| Comparative Example 1 | 2 hours | 900° C. | 0.03 | 0 | Poor |
| Comparative Example 2 | 24 hours | 600° C. | 0.05 | 0 | Poor |

The following was confirmed from the above results.

Cracking did not occur in Example 1, whereas cracking did occur in Comparative Examples 1 and 2. In the case of Example 1, peaks due to W, ZnO, and $WMnO_4$ were observed, whereas a $Mn_3O_4$ peak was not detected, which shows that a $Mn_3O_4$ crystalline phase originating from the raw material powder was not observed. Moreover, peaks due to other manganese oxide crystalline phases were also not detected. In the case of Comparative Examples 1 and 2, a $Mn_3O_4$ peak was detected, which shows that a residual $Mn_3O_4$ crystalline phase was observed. The reason for cracking in Comparative Examples 1 and 2 is thought to be that due to inadequate mixing or sintering conditions, the $Mn_3O_4$ crystalline phase remained to an extent such that the $P_{MnO}/P_W$ threshold value of 0.027, which is a condition in the present disclosure, was exceeded.

INDUSTRIAL APPLICABILITY

According to the present disclosure, it is possible to provide a Mn—Zn—W—O sputtering target having excellent crack resistance that is particularly suitable for forming a recording layer of an optical information recording medium, and to provide a production method for this sputtering target.

REFERENCE SIGNS LIST

S10 mixing step
S20 sintering step

The invention claimed is:
1. A Mn—Zn—W—O sputtering target comprising a chemical composition containing Mn, Zn, W, and O, the chemical composition being sintered to form the Mn—Zn—W—O sputterinq target, wherein
the chemical composition does not contain Cu,
the chemical composition contains 4 at % to 40 at % of Mn, 15 at % to 60 at % of Zn, and 5 at % to 40 at % of W relative to 100 at %, in total, of Mn, Zn, and W, and
from an X-ray diffraction pattern of the Mn—Zn—W—O sputtering target, a ratio $P_{MnO}/P_w$ of a maximum peak intensity $P_{MnO}$ of a peak due to a manganese oxide composed only of Mn and O to a maximum peak intensity $P_w$ of a peak due to W is 0.027 or less, wherein a manganese oxide crystalline phase is not substantially observed in the Mn—Zn—W—O sputtering target, and from the X-ray diffraction pattern of the Mn—Zn—W—O sputtering target, a peak due to a $WMnO_4$ crystalline phase is observed.

2. The Mn—Zn—W—O sputtering target according to claim 1, wherein
from the X-ray diffraction pattern of the Mn—Zn—W—O sputtering target, a ratio $P_{WMnO}/P_W$ of a maximum peak intensity $P_{WMnO}$ of a peak due to a $WMnO_4$ crystalline phase to the maximum peak intensity $P_W$ is 0.024 or more.

3. The Mn—Zn—W—O sputtering target according to claim 1, wherein
the chemical composition further includes a single one or two or more elements selected from the group consisting of Mg, Ag, Ru, Ni, Zr, Mo, Sn, Bi, Ge, Co, Al, In, Pd, Ga, Te, V, Si, Ta, Cr, and Tb.

4. A production method for producing the Mn—Zn—W—O sputtering target according to claim 1, comprising:
a mixing step of wet mixing a mixed powder containing a powder including a Mn as a component, a powder including a Zn as a component, and a powder including a W as a component for 12 hours or longer; and
a sintering step of sintering the mixed powder at a temperature of 700° C. or higher after the mixing step.

5. The production method according to claim 4, wherein the powder including the Mn is selected from a powder of a manganese oxide, the powder including the Zn is selected from a powder of a zinc oxide, and the powder including the W is selected from a metal tungsten powder.

6. The production method according to claim 4, wherein the mixed powder further includes a powder formed from a single one element or compound of two or more elements selected from the group consisting of Mg, Ag, Ru, Ni, Zr, Mo, Sn, Bi, Ge, Co, Al, In, Pd, Ga, Te, V, Si, Ta, Cr, and Tb.

* * * * *